United States Patent
Bucksch

(10) Patent No.: US 7,375,508 B2
(45) Date of Patent: May 20, 2008

(54) DEVICE AND A PROCESS FOR THE CALIBRATION OF A SEMICONDUCTOR COMPONENT TEST SYSTEM

(75) Inventor: Thorsten Bucksch, München (DE)

(73) Assignee: Infineon Technologies AG, Munich (DE)

( * ) Notice: Subject to any disclaimer, the term of this patent is extended or adjusted under 35 U.S.C. 154(b) by 287 days.

(21) Appl. No.: 11/167,930

(22) Filed: Jun. 28, 2005

(65) Prior Publication Data
US 2006/0005089 A1    Jan. 5, 2006

(30) Foreign Application Priority Data
Jun. 29, 2004    (DE)    ............... 10 2004 031 436

(51) Int. Cl.
*G01R 31/02* (2006.01)
(52) U.S. Cl. .................................... 324/158.1; 324/754
(58) Field of Classification Search ................... None
See application file for complete search history.

(56) References Cited

U.S. PATENT DOCUMENTS 6,622,103 B1 *   9/2003   Miller .................... 702/89
7,061,227 B2 *   6/2006   Bucksch et al. ........ 324/158.1

FOREIGN PATENT DOCUMENTS

| DE | 19922907 A1 | 12/1999 |
| DE | 10141025 A1 | 3/2003 |
| DE | 10056882 C2 | 6/2003 |
| DE | 10330043 A1 | 2/2005 |
| JP | 2002-107438 A | 4/2002 |

* cited by examiner

*Primary Examiner*—Minh N. Tang
(74) *Attorney, Agent, or Firm*—Slater & Matsil, L.L.P.

(57) ABSTRACT

A device and a process for the calibration of a semiconductor component test system The invention relates to a process and a device for the calibration of a probe card and/or of a semi-conductor component test apparatus including a first connection, at which a corresponding signal, in particular a calibration signal can be applied, and a second connection, connected or connectable with the first connection, at which the signal, in particular the calibration signal, can be emitted, and a third connection, at which a corresponding further signal, in particular a calibration signal, can be applied, and a fourth connection, connected or connectable with the third connection, at which the further signal, in particular the calibration signal, can be emitted.

9 Claims, 2 Drawing Sheets

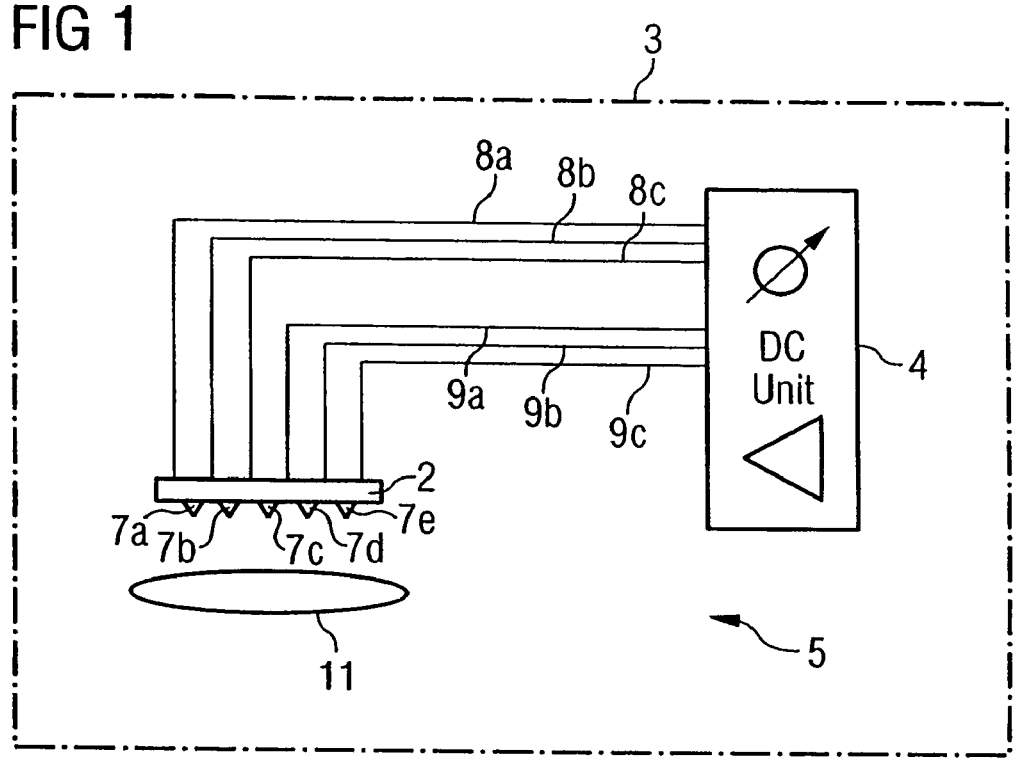
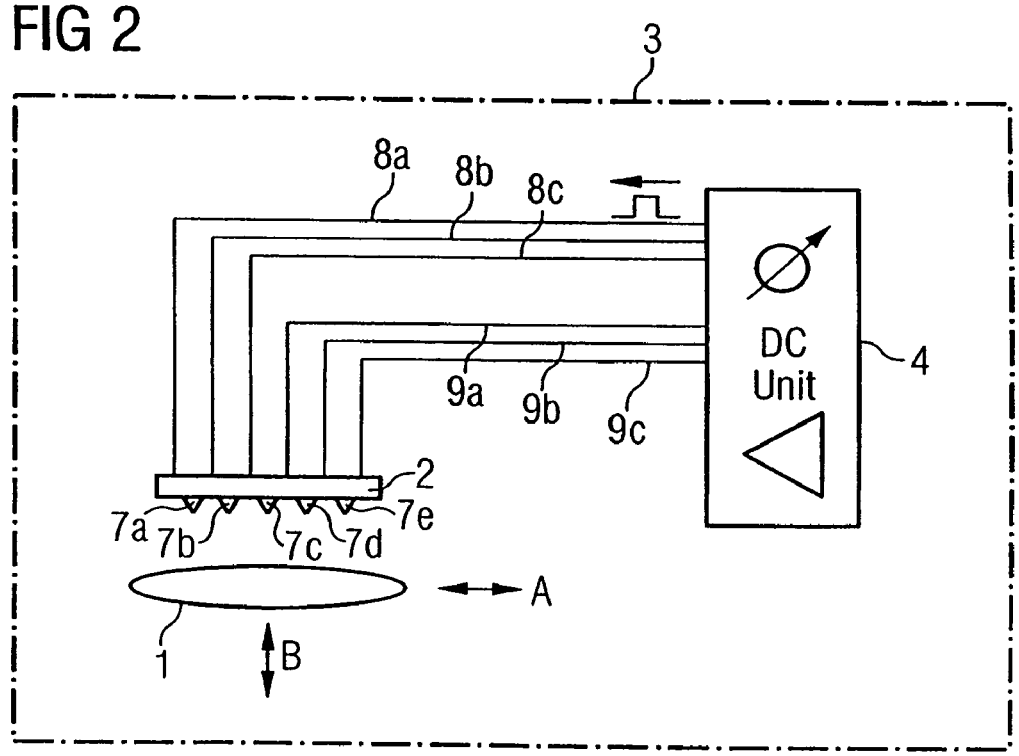

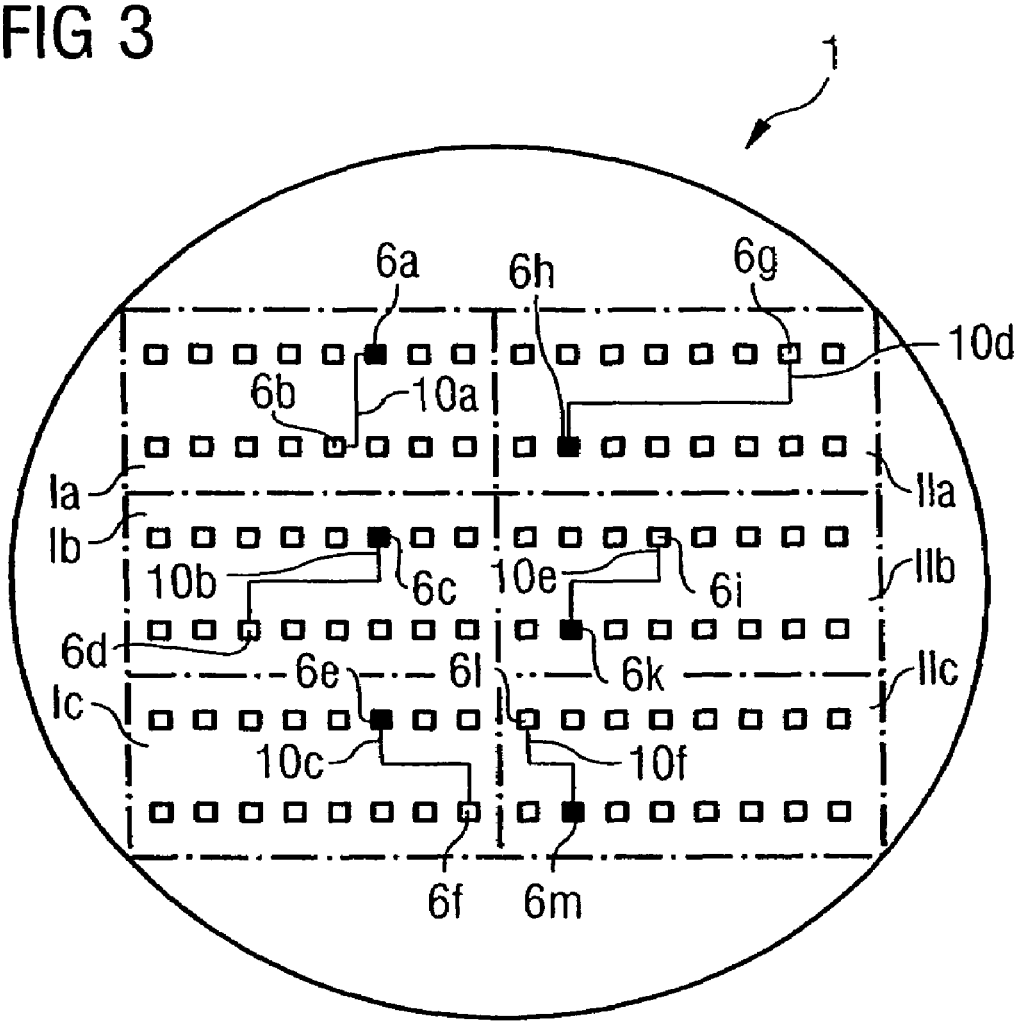

DEVICE AND A PROCESS FOR THE CALIBRATION OF A SEMICONDUCTOR COMPONENT TEST SYSTEM

RELATED APPLICATIONS

This application claims priority to German Application No. 10 2004 031 436.5 filed Jun. 29, 2004, which is incorporated herein, in its entirety, by reference.

TECHNICAL FIELD OF THE INVENTION

The invention relates to a process for the calibration of a probe card and/or of a semi-conductor component test apparatus, as well as a device for the calibration of a probe card and/or of a semi-conductor component test apparatus.

BACKGROUND OF THE INVENTION

Semi-conductor components, e.g. corresponding integrated (analog and/or digital) computing circuits, semi-conductor memory components such as function storage components (PLAs, PALs, etc.) and table memory-components (e.g. ROMs and RAMs, in particular SRAMs and DRAMs), etc. are subjected—e.g. while in a semi-completed and/or a completed state—to numerous tests at several test stations.

For testing the semi-conductor components, a corresponding semi-conductor component test apparatus may be provided, which generates the test signals for testing the semi-conductor components at the test station in question.

For instance the signals required for testing the semi-conductor components still present on the corresponding wafer, may—at a first test station—for instance be generated by a test apparatus connected to a corresponding semi-conductor component test card ("probe card") and sent to the relevant pads of the semi-conductor components by means of corresponding needle-shaped connections ("contact pins") provided on the test card.

The signals emitted by the semi-conductor components to corresponding pads in response to the input test signals, are scanned by corresponding, needle-shaped connections ("contact pins") on the probe card, and relayed (e.g. via a corresponding signal line connecting the probe card with the test apparatus) to the test apparatus where an evaluation of the corresponding signals may take place.

After the wafer has been sawn up, the components—individually available by now—may be individually loaded into so-called carriers (i.e. into an appropriate container) and transported to a further test station.

At the further test station the carriers are inserted into a corresponding adapter and/or socket—connected to a (further) test apparatus—whereafter the components present in each carrier are then subjected to further test procedures.

In order to test the semi-conductor components present in the carriers the corresponding test signals generated by the test apparatus are relayed via the adapters and the carriers (and/or corresponding connections of the carriers) to the corresponding pads of the relevant semi-conductor components.

The signals emitted by the semi-conductor components at corresponding pads in response to the input test signals are scanned by corresponding carrier connections and relayed via the adapter (and a corresponding signal line connecting the adapter to the test apparatus) to the test apparatus, where an evaluation of corresponding signals may take place.

In correspondingly similar fashion the semi-conductor components may be tested for instance after being finally installed in corresponding component housings (e.g. corresponding plug-in or surface mounted housings) and/or after the housings—provided with corresponding semi-conductor components—have been installed in corresponding electronic modules, etc.

In order to achieve a high degree of accuracy in the above test procedures (in particular a high degree of accuracy in the test signals used and/or measured during the above test procedures), the relevant test apparatus may be subjected—before the start of the actual test procedure—to a calibration and/or set-up process.

For instance, a corresponding calibration signal may be emitted onto a signal line connecting the corresponding test apparatus with the relevant probe card, the relevant adapter etc. (e.g. the relevant carrier or housing adapter) by the relevant test apparatus, and the reflected signal induced by the calibration signal measured and evaluated by the test apparatus.

This process is relatively inaccurate.

Alternatively a so-called point-to-point-calibration and/or point-to-point set-up process may be used.

In this process the calibration signal emitted by the test apparatus onto the above signal line (e.g. by a corresponding calibration device) is measured and evaluated there—or approximately there—where it would have been received in each case by the relevant component during the later, actual test.

In this way it can be ensured that the signals received from the relevant component by the test apparatus—during the later, actual test—correspond with the test signals required for each relevant test (with as close to exactly the voltage levels required in each case and/or close to exactly the time behavior required, etc.).

The testing of semi-conductor components still present on a corresponding wafer with the aid of the above probe cards (and similarly also the calibration of the test apparatus used in each case) may take place in a sub-system (e.g. in a corresponding micro clean room system) isolated from the environment.

In order to perform the above calibration and/or set-up process, the relevant test apparatus is connected—via a corresponding signal line—with a corresponding device (movable within the sub-system) containing several (e.g. three) needle-shaped connections and/or contact pins (e.g. a SPP=short pin plate).

For calibrating the test apparatus, the SPP (short pin plate) is moved towards a calibration device (e.g. an NAC=needle auto-calibration device), in particular its NAC plate (needle auto-calibration plate) in such a way that the connections and/or contact pins of the SPP—as required in each case—make contact with the connections (pads) of the (NAC) calibration device—as required in each case—(and/or the connections of its needle plate (needle auto calibration plate) as required in each case).

A calibration signal emitted by the test apparatus—via the above signal line—may then be measured and evaluated by the calibration device.

In correspondingly inverted fashion, a (further) calibration signal emitted by the calibration device (via a corresponding NAC pad and a corresponding SPP contact pin) may be relayed to the test apparatus to be measured and evaluated there.

After the calibration of the test apparatus, the SPP may then again be removed from the NAC device, in particular from the NAC plate, whereafter e.g. a corresponding probe card calibration and/or set-up process may be performed.

For this, the probe card (correspondingly similar to the above SPP) may be moved towards the above calibration device (NAC device, in particular its NAC plate (needle auto calibration plate)) in such a way that the connections and/or contact pins of the probe card—as required in each case—make contact with the requisite connections (pads) of the calibration device in each case.

A corresponding calibration signal emitted by the calibration device (NAC device) is then relayed via a corresponding NAC pad—and a corresponding probe card contact pin in contact with it—to the probe card.

The signal emitted by the probe card in response to the input calibration signal to a corresponding contact pin, is scanned by a corresponding NAC pad—which is in contact with the contact pin—and then measured and evaluated by the calibration device.

One disadvantage inter alia of the above procedure is that during the calibration of the test apparatus the calibration signals need to be relayed via additional pins (namely the above SPP contact pins), which may lead to inaccuracies.

SUMMARY OF THE INVENTION

The invention discloses a novel device and a novel process for the calibration of a probe card and/or of a semi-conductor component test apparatus.

BRIEF DESCRIPTION OF THE DRAWINGS

The invention is described in more detail below with reference to the exemplary embodiments and drawings, in which:

FIG. 1 shows the basic construction of a—state of the art—semi-conductor component test system, as used for testing semi-conductor components arranged on a wafer, with a probe card and a test apparatus connected to it.

FIG. 2 shows the basic construction—in terms of an embodiment example of the invention—of the devices used for calibrating the test system shown in FIG. 1, and/or the test apparatus and/or the probe card shown there.

FIG. 3 shows a wafer—viewed from the top—used for calibrating the test system shown in FIG. 1, and/or the test apparatus shown there and/or the probe card—in order to illustrate the calibration routing structures provided on the wafer.

DETAILED DESCRIPTION OF THE INVENTION

FIG. 1 shows the basic construction of a—state of the art—semi-conductor component test system 5, used at a test station 3 for testing semi-conductor components arranged and/or manufactured on a—conventional—wafer 11.

The semi-conductor components to be tested and still present on the wafer 11 (i.e. the corresponding silicon disk) may for instance be corresponding integrated (analog and/or digital) computing circuits, and/or semi-conductor memory components such as e.g. function storage components (PLAs, PALs, etc.) or table memory components (e.g. ROMs or RAMS), in particular SRAMs or DRAMs (here e.g. DRAMs (Dynamic Random Access Memories and/or dynamic Read-Write memories) with a double data rate (DDR–DRAMs=Double Data Rate DRAMs)).

The test signals required for testing the semi-conductor components—still present on the silicon disk and/or on the wafer 11—are relayed from a test apparatus 4 (here: a DC test apparatus) via one or several corresponding signal lines ("driver channels" 8*a*, 8*b*, 8*c*) to a semi-conductor component test card and/or probe card 2, and—via corresponding contact pins 7*a*, 7*b*, 7*c*, 7*d*, 7*e* provided on the probe card—to corresponding connections and/or pads provided on the semi-conductor components.

As is apparent from FIG. 1 (and FIG. 2) the contact pins 7*a*, 7*b*, 7*c*, 7*d*, 7*e* reach downwards from the underside of the probe card 2.

The signals emitted in response to the test signals applied to corresponding (e.g. to the above or other, different) semi-conductor component connections and/or pads are—correspondingly inverted as described above—scanned by corresponding contact pins 7*a*, 7*b*, 7*c*, 7*d*, 7*e* of the probe card 2, and sent via the above, or one or several further signal lines ("comparator channels" 9*a*, 9*b*, 9*c*) to the test apparatus 4, where an evaluation of corresponding signals may then take place.

As is apparent from FIG. 1, the above probe card 2, the semi-conductor components (and/or the wafer 11) to be tested (as well as the above test apparatus 4 where applicable) are arranged into a sub-system isolated from the environment (e.g. a corresponding micro clean room) at test station 3.

To calibrate test system 5, and/or the test apparatus 4 and/or the probe card 2 shown there (e.g. before performing the above test procedure (and/or between several test procedures performed at the above test station 3)) it is possible, in terms of an embodiment example of the invention, for instance to apply the procedure described more closely below with reference to FIG. 2 and FIG. 3 (for instance with the use of a corresponding structure arranged in the micro clean room system shown in FIG. 2, and/or—in particular—with the use of the special calibration wafer 1 with the special calibration routing structures shown in FIG. 2 and FIG. 3 (and/or with a specially structured metallization layer)).

In each case, a driver channel and a comparator channel are selected from the existing tester channels (i.e. from the driver channels 8*a*, 8*b*, 8*c* and the comparator channels 9*a*, 9*b*, 9*c* respectively) as reference driver channel and as reference comparator channel (for instance the driver channel 8*a* as reference driver channel, and the comparator channel 9*a* as reference comparator channel).

As is more closely described below, the calibration process is performed in several steps Ia, Ib, Ic, IIa, IIb, IIc, etc., for which—as shown in FIG. 3—a wafer structure field Ia, Ib, Ic, IIa, IIb, IIc, allocated to the process step in question (one of several structure fields Ia, Ib, Ic, IIa, IIb, IIc provided on wafer 1), is used.

In terms of FIG. 2 each tester channel (more accurately: each driver channel 8*a*, 8*b*, 8*c*, and each comparator channel 9*a*, 9*b*, 9*c*) is electrically connected with a contact pin of the probe card 2 in each case allocated to it.

As is more closely described below, a corresponding, separate delay mechanism can be provided in the test apparatus 4 for each driver and for each comparator channel 8*a*, 8*b*, 8*c*, 9*a*, 9*b*, 9*c*.

The delay mechanisms foreseen for the driver channels 8*a*, 8*b*, 8*c* impose an appropriate variably adjustable delay period on the signals (e.g. corresponding calibration test signals) emitted by the test apparatus 4 via the relevant driver channel; in correspondingly similar fashion the delay mechanisms provided for the comparator channels 9*a*, 9*b*, 9*c* also impose a correspondingly variably adjustable delay period on the signals (e.g. corresponding calibration test signals) received by the test apparatus 4 via each comparator channel in question.

During a (first) step Ia of the calibration process, the wafer 1 is moved (preferably automatically, i.e. by means of a suitable mechanism) to the underside of the probe card 2 in such a way (cf. for instance the arrows A, B shown in FIG. 2), that the contact pin of the probe card 2 allocated to the reference driver channel, and electrically connected to it—makes contact—in a (first) structure field Ia of the wafer 1—with the contact field 6a provided for the reference driver channel 8a and that a contact pin of the probe card 2 allocated to the ((first) non-reference) comparator channel (e.g. to the comparator channel 9b) and electrically connected to it, makes contact—in the (first) structure field Ia of the wafer 1—with a contact field 6b provided for this comparator channel 9b.

As is apparent from FIG. 3, the contact field 6a provided for the reference driver channel 8a—in the first structure field Ia of the wafer 1—is electrically connected via a corresponding line 10a, created by the calibration routing structure on the wafer 1, with the contact field 6b provided for the ((first) non-reference) comparator channel 9b.

A calibration test signal and/or calibration test pulse signal—emitted correspondingly chronologically retarded by a corresponding delay mechanism foreseen for the reference driver channel 8a—and applied by the test apparatus 4 to the reference driver channel 8a (at a particular point of time $t_0$, selected in relation to a reference pulse (e.g. to its positive flank))—is relayed via the reference driver channel 8a and the contact pin of the probe card 2 allocated to it, to the contact field 6a provided for the reference driver channel 8a.

From the contact field 6a, the calibration test signal and/or calibration test pulse signal is relayed via the above wafer-line 10a to the contact field 6b provided for the above comparator channel 9b, scanned there by the contact pin of the probe card 2 allocated to the comparator channel 9b, and sent via the above comparator channel 9b to the test apparatus 4 at a point of time $t_{x,1,1}$ ("test signal input point of time"), which can for instance be related to the reference pulse (e.g. to its positive flank), retarded in relation to the above calibration test signal output point of time by reason of the signal propagation delay (whereby the calibration test signal is entered correspondingly chronologically retarded into the test apparatus 4 by means of a corresponding delay mechanism provided for the comparator channel 9b). In the test apparatus 4, the test signal input point of time $t_{x,1,1}$ of the calibration test signal, sent by the comparator channel 9b and correspondingly retarded by the corresponding delay mechanism, is measured (for example by measuring the time elapsed since the last positive flank of the reference pulse), and compared with a—predetermined—reference point of time $t_x$ (also related to e.g. the positive flank of the reference pulse (calibration process sub-step Ia,1)).

If the value of the test signal input point of time $t_{x,1,1}$ is higher than the value of the reference point of time $t_x$, the delay period generated by the delay mechanism allocated to the comparator channel 9b is correspondingly reduced.

If however the value of the test signal input point of time $t_{x,1,1}$ is lower than the value of the reference point of time $t_x$, the delay period generated by the delay mechanism allocated to the comparator channel 9b is correspondingly increased.

Then a calibration test signal and/or calibration test pulse signal—correspondingly chronologically (identically) retarded by the delay mechanism—is again made available by the test apparatus 4 to the reference driver channel 8a (e.g. at a correspondingly identical point of time $t_0$ (selected as above in relation to the reference pulse (e.g. to its positive flank)) and sent via the reference driver channel 8a and the contact pin of the probe card 2 allocated to it, the contact field 6a provided for the reference driver channel 8a, the wafer-line 10a, the contact field 6b provided for the above comparator channel 9b, the contact pin of probe card 2 allocated to the comparator channel 9b, and the comparator channel 9b, to the test apparatus 4 (whereby the calibration test signal, correspondingly more or less strongly chronologically retarded than before by the corresponding delay mechanism provided for the comparator channel 9b, is entered in the test apparatus 4 at a test signal input point of time $t_{x,1,2}$).

In test apparatus 4 the test signal input point of time $t_{x,1,2}$ of the calibration test signal, sent via the comparator channel 9b and correspondingly retarded by the corresponding delay mechanism, is measured (for example by measuring the time elapsed since the last positive flank of the reference pulse) and compared with the—predetermined—reference point of time $t_x$ (calibration process sub-step Ia,2).

If the value of the test signal input point of time $t_{x,1,2}$ is higher than the value of the reference point of time $t_x$, the delay period generated by the delay mechanism allocated to the comparator channel 9b is correspondingly reduced.

If however the value of the test signal input point of time $t_{x,1,2}$ is lower than the value of the reference point of time $t_x$, the delay period generated by the delay mechanism allocated to the comparator channel 9b is correspondingly increased.

Then a corresponding calibration test signal and/or calibration test pulse signal is again applied by the test apparatus 4 to the reference driver channel 8a and the test signal input point of time $t_{x,1,3}$ of the calibration test signal, sent back by comparator channel 9b and correspondingly retarded by the corresponding delay mechanism, is measured in the test apparatus 4 and compared with the—predetermined—reference point of time $t_x$ etc., etc., until it is determined that the test signal input point of time and the reference point of time $t_x$ are identical and/or essentially identical (calibration process sub-step Ia,3).

The delay period $t_{delay,1,1}$ (and/or data characterizing the applicable setting of the delay mechanism) generated by the delay mechanism allocated to the comparator channel 9b is stored in a corresponding storage facility of the test apparatus 4 (calibration process sub-step Ia,4). p Then the setting of the delay mechanism allocated to the comparator channel 9b is again—deliberately—correspondingly changed, e.g. the delay period generated by the delay mechanism allocated to the comparator channel 9b is correspondingly increased or reduced, and the steps corresponding with the above calibration process sub-steps Ia,1-Ia,4 are again executed.

In other words, the test apparatus 4 again applies a corresponding calibration test signal and/or calibration test pulse signal to the reference driver channel 8a, and in the test apparatus 4 the test signal input point of time of the calibration test signal, sent back correspondingly retarded—differently than before—by the comparator channel 9b is measured by the corresponding delay mechanism, and compared with the—predetermined—reference point of time $t_x$, etc., etc., until it is—again—determined that the test signal input point of time and the reference point of time $t_x$ are identical and/or essentially identical.

The delay period $t_{delay,1,2}$ (and/or data characterizing the applicable setting of the delay mechanism) then generated by the delay mechanism allocated to the comparator channel 9b is then—again—stored in the above storage facility of the test apparatus 4.

Next the setting of the delay mechanism allocated to the comparator channel 9b can—again—be correspondingly deliberately changed, e.g. the delay period generated by the delay mechanism can be correspondingly increased or reduced, and the above steps corresponding with the calibration process sub-steps Ia,1-Ia,4 can again be executed.

The delay period $t_{delay,1,3}$ (and/or data characterizing the applicable setting of the delay mechanism) then determined for the delay mechanism allocated to the comparator channel 9b—when the test signal input points of time and reference points of time $t_x$ are identical—is then—again—stored in the storage facility of the test apparatus 4, etc.

As a last step, a median value of the delay periods $t_{delay,1,1}$, $t_{delay,1,2}$, $t_{delay,1,3}$, etc., determined for the delay mechanism allocated to the comparator channel 9b and stored in the storage facility, is established and the (median) delay period determined in this way (and/or the setting of the delay mechanism allocated to this setting) is fixed for the normal operation of the test apparatus 4 (during the testing of components) as the standard delay period and/or standard setting for the corresponding delay mechanism.

By repeatedly performing the above calibration process sub-steps and the above delay period calculation, faults and measurement deviations occurring during individual measurements can be determined and the accuracy of the calibration increased in this way.

Next, a second (main) step Ib of the calibration process is performed:

Here the wafer 1 is first moved (preferably automatically, i.e. by means of a suitable mechanism) away again from the underside of the probe card then sideways and finally towards the underside of the probe card 2 (cf. for instance the arrows A, B shown in FIG. 2), in such a way that the contact pin of the probe card 2 allocated to the reference driver channel 8a and electrically connected to it, makes contact—in a (second) structure field Ib of the wafer 1—with a contact field 6c provided for the reference driver channel 8a, and that a contact pin of the probe card 2 allocated to a ((second) non-reference) comparator channel (e.g. to the comparator channel 9c) and electrically connected to it, makes contact with a contact field 6d provided for this comparator channel 9c in the (second) structure field Ib of the wafer 1.

As is apparent from FIG. 3, the contact field 6c provided for the reference driver channel 8a—in the second structure field Ib of the wafer 1—is electrically connected via a corresponding line 10b, created by the calibration routing structure on the wafer 1, with the contact field 6d provided for the ((second) non-reference) comparator channel 9c.

A calibration test signal and/or calibration test pulse, emitted correspondingly chronologically retarded—by the corresponding delay mechanism foreseen for the reference driver channel 8a—and applied by the test apparatus 4 to the reference driver channel 8a (at a particular point of time $t_0$, selected in relation to a reference pulse corresponding with the above reference point of time (e.g. to its positive flank)) is relayed via the reference driver channel 8a and the contact pin of the probe card 2 allocated to it, to the contact field 6c provided for the reference driver channel 8a.

From the contact field 6c the calibration test signal and/or calibration test pulse signal is relayed via the above wafer-line 10b to the contact field 6d provided for the above comparator channel 9c, where it is scanned by the contact pin of the probe card 2 allocated to the comparator channel 9c, and sent via the above comparator channel 9c to the test apparatus 4 at a point of time $t_{x,2,1}$ ("test signal input point of time"), which can be related to the reference pulse (e.g. to its positive flank) and which has been retarded in relation to the above calibration test signal output point of time by reason of the signal propagation delay (whereby the calibration test signal is entered correspondingly chronologically retarded by means of a corresponding delay mechanism provided for the comparator channel 9c, into the test apparatus 4).

In test apparatus 4 the test signal input point of time $t_{x,2,1}$ of the calibration test signal sent by the comparator channel 9c, and correspondingly retarded by the corresponding delay mechanism, is measured (for example by measuring the time elapsed since the last positive flank of the reference pulse), and compared with the—above, predetermined (also related to e.g. the positive flank of the reference pulse)—reference point of time $t_x$ (calibration process sub-step Ib,1).

If the value of the test signal input point of time $t_{x,2,1}$ is higher than the value of the reference points of time $t_x$, the delay period generated by the delay mechanism allocated to the comparator channel 9c is correspondingly reduced.

If however the value of the test signal input point of time $t_{x,2,1}$ is lower than the value of the reference point of time $t_x$, the delay period generated by the delay mechanism allocated to the comparator channel 9c is correspondingly increased.

Then a calibration test signal and/or calibration test pulse signal, correspondingly chronologically (identically) retarded by the delay mechanism, is again applied by the test apparatus 4 to the reference driver channel 8a (at a correspondingly identical point of time $t_0$, (e.g. selected as above in relation to the reference pulse (e.g. to its positive flank)) and sent via the reference driver channel 8a and the contact pin of the probe card 2 allocated to it, the contact field 6c provided for the reference driver channel 8a, the wafer-line 10b, the contact field 6d provided for the above comparator channel 9c, the contact pin of the probe card 2 allocated to the comparator channel 9c, and the comparator channel 9c to the test apparatus 4 (whereby the calibration test signal is applied, correspondingly more or less strongly chronologically retarded than before by the corresponding delay mechanism provided for the comparator channel 9c, to the test apparatus 4 at a test signal input point of time $t_{x,2,2}$).

In test apparatus 4 the test signal input point of time $t_{x,2,2}$ of the calibration test signal sent by the comparator channel 9c, and correspondingly retarded by the corresponding delay mechanism, is measured (for example by measuring the time elapsed since the last, positive flank of the reference pulse) and compared with the—predetermined—reference point of time $t_x$ (calibration process sub-step Ib,2).

If the value of the test signal input point of time $t_{x,2,2}$ is higher than the value of the reference point of time $t_x$, the delay period generated by the delay mechanism allocated to the comparator channel 9c is correspondingly reduced.

If however the value of the test signal input point of time $t_{x,2,2}$ is lower than the value of the reference point of time $t_x$, the delay period generated by the delay mechanism allocated to the comparator channel 9c is correspondingly increased.

Then a corresponding calibration test signal and/or calibration test pulse signal is again applied by the test apparatus 4 to the reference driver channel 8a, and the test signal input point of time $t_{x,2,3}$ of the calibration test signal, sent back by the comparator channel 9c correspondingly retarded by the corresponding delay mechanism, is measured in test apparatus 4 and compared with the—predetermined—reference point of time $t_x$ etc., etc., until it is determined that the test signal input point of time and the reference point of time $t_x$ are identical and/or essentially identical (calibration process sub-step Ib,3).

The delay period $t_{delay,2,1}$ (and/or data characterizing the applicable setting of the delay mechanism) generated by the delay mechanism allocated to the comparator channel 9c is stored in a corresponding storage facility of the test apparatus 4 (calibration process sub-step Ib,4).

Then the setting of the delay mechanism allocated to the comparator channel 9c is again—deliberately—correspondingly changed, e.g. the delay period generated by the delay mechanism is correspondingly increased or reduced, and the steps corresponding with the above calibration process sub-steps Ib,1-Ib,4 are executed again.

In other words, the test apparatus 4 again applies a corresponding calibration test signal and/or calibration test pulse signal to the reference driver channel 8a, and the test signal input point of time of the calibration test signal, sent back via the comparator channel 9c correspondingly retarded—differently than before—is measured in the test apparatus 4 by the corresponding delay mechanism, compared with the—predetermined—reference point of time $t_x$ until it is—again—determined that the test signal input point of time and the reference point of time $t_x$ are identical and/or essentially identical.

The delay period $t_{delay,2,2}$ (and/or data characterizing the applicable setting of the delay mechanism) then generated by the delay mechanism allocated to the comparator channel 9c is then—again—stored in the above storage facility of the test apparatus 4.

Next the setting of the delay mechanism allocated to the comparator channel 9c can—again—be deliberately correspondingly changed, e.g. the delay period generated by the delay mechanism can be correspondingly increased or reduced and the steps corresponding with the above calibration process sub-steps Ib,1k-Ib,4 can be executed.

The delay period $t_{delay,2,3}$ (and/or data characterizing the applicable setting of the delay mechanism) then determined for the delay mechanism allocated to the comparator channel 9c—when the test signal input point of time and the reference point of time $t_x$ are identical—is then—again—stored in the storage facility of the test apparatus 4, etc.

As a last step, a median value is established for the delay periods $t_{delay,2,1}$, $t_{delay,2,2}$, $t_{delay,2,3}$ etc. stored in the storage facility for the delay mechanism allocated to the comparator channel 9c and the (median) delay period (and/or the setting of the delay mechanism allocated to this setting) determined in this way is fixed for the normal operation of the test apparatus 4 (during the testing of components) as the standard delay period and/or standard setting for the corresponding delay mechanism.

Then a third (main) step Ic of the calibration process can be executed:

Hereby the wafer 1 is moved (preferably automatically, i.e. by means of a suitable mechanism) first again away from the underside of the probe card, then in a sideways direction, and finally towards the underside of the probe card 2 in such a way (cf. for instance the arrows A, B shown in FIG. 2), that the contact pin of the probe card 2 allocated to reference driver channel 8a and electrically connected to it—makes contact—in a (third) structure field Ic of the wafer 1—with the contact field 6e provided for the reference driver channel 8a, and that a contact pin of the probe card 2 allocated to a ((third) non-reference) comparator channel and electrically connected to it, makes contact—in the (third) structure field Ic of the wafer 1—with a contact field 6f provided for this (third) comparator channel.

As is apparent from FIG. 3, the contact field 6e provided for the reference driver channel 8a—in the third structure field Ic of the wafer 1—is electrically connected via a corresponding line 10c, created by the calibration routing structure on the wafer 1, with the contact field 6f provided for the ((third) non-reference) comparator channel.

Next—for the ((third) non-reference) comparator channel—several calibration process sub-steps may then be correspondingly repeatedly performed in succession for the first and second non-reference comparator channel as described above in relation to the calibration process sub-steps Ia,1-Ia,4 and/or Ib,1-Ib,4. (i.e.—repeatedly in succession—the corresponding calibration process sub-steps corresponding with the above calibration process sub-steps Ia,1-Ia,4 and/or Ib,1-Ib,4).

Thereby—corresponding to what is described above—delay periods may be determined for the ((third) non-reference) comparator channel and/or the delay mechanism allocated to it, for which the test signal input point of time and the reference point of time $t_x$ are identical and/or essentially identical.

Then a median value of the corresponding determined delay periods can—again—be established, and the (median) delay period value determined in this way (and/or the setting of the delay mechanism allocated to it) fixed for the normal operation of the test apparatus 4 (during the testing of components) as standard delay period and/or standard setting for the corresponding delay mechanism.

The steps corresponding with the above process steps Ia, Ib, Ic (with repeatedly executed successive calibration process sub-steps corresponding with the above calibration process sub-steps Ia,1-Ia,4 and/or Ib,1-Ib,4 in each case) are performed for all non-reference comparator channel with the use of the above reference driver channel 8a.

Next (or alternatively, even before the above process steps Ia, Ib, Ic)—with the use of the above reference comparator channels (here: the comparator channel 9a) instead of the reference driver channel (here: the driver channel 8a)—the process steps IIa, IIb, IIc corresponding with the above process steps Ia, Ib, Ic are executed:

For instance during a process step IIa of the calibration process—e.g. executed in connection with the above process steps Ia, Ib, Ic—the wafer 1 is moved (preferably automatically, i.e. by means of an appropriate mechanism) towards the underside of the probe card 2 in such a way (cf. for instance the arrows A, B shown in FIG. 2), that the contact pin of the probe card 2 allocated to a ((first) non-reference ) driver channel 8b and electrically connected to it, makes contact—in a (fourth) structure field IIa of the wafer 1—with a contact field 6g provided for this driver channel 8b and that a contact pin of the probe card 2 allocated to the reference comparator channel 9a and electrically connected to it makes contact—in the (fourth) structure field IIa of the wafer 1—with a contact field 6h provided for this comparator channel 9a.

As is apparent from FIG. 3, the contact field 6g provided for the driver channel 8b—in the fourth structure field IIa of the wafer 1—is electrically connected via a corresponding line 10d, created by the calibration routing structure on the wafer 1, with the contact field 6h provided for the reference comparator channel 9a.

A calibration test signal and/or calibration test pulse signal applied by the test apparatus 4 to the driver channel 8b (at a particular point of time $t_0$, e.g. selected in relation to a reference pulse (e.g. its positive flank))—correspondingly chronologically retarded by a corresponding delay mechanism provided for the driver channel 8b—is relayed via the driver channel 8b and the contact pin of the probe card 2 allocated to it, to the contact field 6g provided for the driver channel 8b.

From the contact field 6g the calibration test signal and/or calibration test pulse signal is relayed via the above wafer line 10d to the contact field 6h provided for the above reference comparator channel 9a, and there it is scanned by the contact pin of the probe card 2 allocated to the reference comparator channel 9a, and sent via the above reference comparator channel 9a to the test apparatus 4 at a point of time $t_{x,4,1}$ ("test signal input point of time") that can be related e.g. to the reference pulse (e.g. of its positive flank) retarded in relation to the above calibration test signal output by reason of the signal propagation delay (whereby the calibration test signal is entered into the test apparatus 4, correspondingly chronologically retarded by means of a delay mechanism provided for the reference comparator channel 9a).

In test apparatus 4 the test signal input point of time $t_{x,4,1}$ of the calibration test signal sent by the reference comparator channel 9a, and correspondingly retarded by the corresponding delay mechanism, is measured (for example by measuring the time elapsed since the last positive flank of the reference pulse) and compared with a—predetermined—reference point of time $t_x$ (also for instance related to the positive flank of the reference pulse and identical to the above reference point of time (calibration process sub-step IIa,1)).

If the value of the test signal input point of time $t_{x,4,1}$ is higher than the value of the reference point of time $t_x$, the delay period generated by the delay mechanism allocated to the driver channel 8b is correspondingly reduced.

If however the value of the test signal input point of time $t_{x,4,1}$ is lower than the value of the reference point of time $t_x$, the delay period generated by the delay mechanism allocated to the driver channel 8b is correspondingly increased.

Then a calibration test signal and/or calibration test pulse signal is again made available by the test apparatus 4 to the driver channel 8b (e.g. at a correspondingly identical point of time $t_0$, selected as above in relation to reference pulse (e.g. of its positive flank)) e.g. correspondingly chronologically more or less strongly retarded as before by the delay mechanism and sent via the driver channel 8b and the contact pin of the probe card 2 allocated to it, the contact field 6g provided for the driver channel 8b, the wafer line 10d, the contact field 6h provided for the above reference comparator channel 9a, the contact pin of the probe card 2 allocated to the reference comparator channel 9a, and the reference comparator channel 9a, to the test apparatus 4 (whereby the calibration test signal, exactly the same as above, is chronologically retarded by the corresponding delay mechanism provided for the reference comparator channel 9a and entered into the test apparatus 4 at a signal input point of time $t_{x,4,2}$ which differs from the above test signal input point of time $t_{x,4,1}$).

In test apparatus 4 the test signal input point of time $t_{x,4,2}$ of the calibration test signal, sent by the reference comparator channel 9b and correspondingly retarded by the corresponding delay mechanism, is measured (for example by measuring the time elapsed since the last positive flank of the reference pulse), and compared with the—predetermined—reference point of time $t_x$ (calibration process sub-step IIa,2).

If the value of the test signal input point of time $t_{x,4,2}$ is higher than the value of the reference points of time $t_x$, the delay period generated by the delay mechanism allocated to the driver channel 8b is correspondingly reduced.

If however the value of the test signal input point of time $t_{x,4,2}$ is lower than the value of the reference point of time $t_x$, the delay period generated by the delay mechanism allocated to the driver channel 8b is correspondingly increased.

Then a corresponding calibration test signal and/or calibration test pulse signal is again applied by the test apparatus 4 to the driver channel 8b, and the test signal input point of time $t_{x,4,3}$ of the calibration test signal sent back by the reference comparator channel 9a correspondingly retarded by the corresponding delay mechanism, is measured in test apparatus 4 and compared with the—predetermined—reference point of time $t_x$ etc., etc., until it is determined that the test signal input point of time and the reference point of time $t_x$ are identical and/or essentially identical (calibration process sub-step IIa,3).

The delay period $t_{delay,4,1}$ (and/or data characterizing the applicable setting of the delay mechanism) generated by the delay mechanism allocated to the driver channel 8b is stored in a corresponding storage facility of the test apparatus 4 (calibration process sub-step IIa,4).

Then the setting of the delay mechanism allocated to the driver channel 8b is again—deliberately—correspondingly changed, e.g. the delay period generated by the delay mechanism is correspondingly increased or reduced, and the steps corresponding with the above calibration process sub-steps IIa,1-Ia,4 are again executed.

In other words, the test apparatus 4 again applies a corresponding calibration test signal and/or calibration test pulse signal to the reference driver channel 8b, and in the test apparatus 4 the test signal input point of time of the calibration test signal, sent back by the comparator channel 9a and correspondingly retarded, is measured by the corresponding delay mechanism, and compared with the—predetermined—reference point of time $t_x$, etc., etc., until it is—again—determined that the test signal input point of time and the reference point of time $t_x$ are identical and/or essentially identical.

The delay period $t_{delay,4,2}$ (and/or data characterizing the applicable setting of the delay mechanism) generated by the delay mechanism allocated to the driver channel 8b is—again—stored in the above storage facility of the test apparatus 4.

Next the setting of the delay mechanism allocated to the driver channel 8b can—again—be deliberately correspondingly changed, e.g. the delay period generated by the delay mechanism can be correspondingly increased or reduced and the steps corresponding with the above calibration process sub-steps IIa,1-IIa,4 can again be executed.

The delay period $t_{delay,4,3}$ (and/or data characterizing the applicable setting of the delay mechanism) again determined for the delay mechanism allocated to the driver channel 8b is then—when the test signal input point of time and reference point of time $t_x$ are identical—again stored in the storage facility of the test apparatus 4, etc.

As a last step, a median value is established for the delay periods $t_{delay,4,1}$, $t_{delay,4,2}$, $t_{delay,4,3}$, etc. stored in the storage facility for the delay mechanism allocated to the comparator channel 9b and the (median) delay period (and/or the setting of the delay mechanism allocated to this setting) determined in this way is fixed for the normal operation of the test apparatus 4 (during the testing of components) as the standard delay period and/or standard setting for the corresponding delay mechanism.

Then a further calibration process main step IIb is executed:

Hereby the wafer 1 is first moved (preferably automatically, i.e. by means of a suitable mechanism) away again from the underside of the probe card, then in a sideways direction, and finally towards the underside of the probe card 2 in such a way (cf. for instance the arrows A, B shown in FIG. 2), that the contact pin of the probe card 2 allocated to a ((second) non-reference) driver channel (e.g. to the driver channel 8c) and electrically connected to it—makes contact—in the (fifth structure field Ic of the wafer 1—with the contact field 6i provided for the driver channel 8c, and that a contact pin of the probe card 2 allocated to the above reference comparator channel 9a and electrically connected to it, makes contact—in the (fifth) structure field IIb of the wafer 1—with a contact field 6k provided for this comparator channel 9a.

As is apparent from FIG. 3, the contact field 6i provided for the driver channel 8c—in the fifth structure field IIb of the wafer 1—is electrically connected with the contact field 6k, provided for the reference comparator channel, 9a via a corresponding line 10e, created by the calibration routing structure on the wafer 1.

A calibration test signal and/or calibration test pulse signal, applied by the test apparatus 4 to the driver channel 8c (at a particular point of time $t_0$, e.g. selected in relation to a reference pulse (e.g. its positive flank))—emitted correspondingly chronologically retarded by a corresponding delay mechanism provided for the driver channel 8c—is relayed via the driver channel 8c and the contact pin of the probe card 2 allocated to it, to the contact field 6i provided for the driver channel 8c.

From the contact field 6i the calibration test signal and/or calibration test pulse signal is relayed via the above wafer line 10e to the contact field 6k provided for the reference comparator channel 9a, where it is scanned by the contact pin of the probe card 2 allocated to the reference comparator channel 9a, and sent via the above reference comparator channel 9a to the test apparatus 4 at a point of time $t_{x,5,1}$ ("test signal input point of time") that can be related (e.g. to the reference pulse (e.g. to its positive flank) and retarded in relation to the above calibration test signal output by reason of the signal propagation delay (whereby the calibration test signal is entered, correspondingly chronologically retarded by means of a corresponding delay mechanism provided for the reference comparator channel 9a, into the test apparatus 4).

In the test apparatus 4 the test signal input point of time $t_{x,5,1}$ of the calibration test signal, sent by the reference comparator channel 9a and correspondingly retarded by the corresponding delay mechanism, is measured (for example by measuring the time elapsed since the last positive flank of the reference pulse), and compared with the—above predetermined reference point of time $t_x$ (also related to e.g. the positive flank of the reference pulse)—(calibration process sub-step IIb,1).

If the value of the test signal input point of time $t_{x,5,1}$ is higher than the value of the reference point of time $t_x$, the delay period generated by the delay mechanism allocated to the driver channel 8c is correspondingly reduced.

If however the value of the test signal input point of time $t_{x,5,1}$ is lower than the value of the reference point of time $t_x$, the delay period generated by the delay mechanism allocated to the driver channel 8c is correspondingly increased.

Then a calibration test signal and/or calibration test pulse signal—chronologically delayed by the delay mechanism (differently than before)—is again applied by the test apparatus 4 to the above driver channel 8c and sent via the driver channel 8c and the contact pin of the probe card 2 allocated to it, the contact field 6i provided for the driver channel 8c, the wafer-line 10e, the contact field 6k provided for the above reference comparator channel 9a, the contact pin of the probe card 2 allocated to the reference comparator channel 9a, and the reference comparator channel 9a to the test apparatus 4 (whereby the calibration test signal, correspondingly retarded by the corresponding delay mechanism provided for the comparator channel 9a, is entered into the test apparatus 4a at a test signal input point of time $t_{x,5,2}$).

In the test apparatus 4 the test signal input point of time $t_{x,5,2}$ of the calibration test signal sent by the reference comparator channel 9a and correspondingly retarded by the corresponding delay mechanism, is measured (for example by measuring the time elapsed since the last positive flank of the reference pulse), and compared with the—above predetermined reference point of time $t_x$ (calibration process sub-step IIb,2).

If the value of the test signal input point of time $t_{x,5,2}$ is higher than the value of the reference point of time $t_x$, the delay period generated by the delay mechanism allocated to the driver channel 8c is correspondingly reduced.

If however the value of the test signal input point of time $t_{x,5,2}$ is lower than the value of the reference point of time $t_x$, the delay period generated by the delay mechanism allocated to the driver channel 8c is correspondingly increased.

Then a corresponding calibration test signal and/or calibration test pulse signal is again applied by the test apparatus 4 to the driver channel 8c, and the test signal input point of time $t_{x,4,2}$ of the calibration test signal sent back by the reference comparator channel 9a, correspondingly retarded by the corresponding delay mechanism, is again measured in test apparatus 4 and compared with the—predetermined—reference point of time $t_x$ etc., etc., until it is determined that the test signal input point of time and the reference point of time $t_x$ are identical and/or essentially identical (calibration process sub-step IIb,3).

The delay period $t_{delay,5,1}$ (and/or data characterizing the applicable setting of the delay mechanism) generated by the delay mechanism allocated to the driver channel 8c, is stored in a corresponding storage facility of the test apparatus 4 (calibration process sub-step IIb,4).

Then the setting of the delay mechanism allocated to the driver channel 8c is again—deliberately—correspondingly changed, e.g. the delay period generated by the delay mechanism is correspondingly increased or reduced, and the steps corresponding with the above calibration process sub-steps IIa,1-Ia,4 are again executed.

In other words, the test apparatus 4 again applies a corresponding calibration test signal and/or calibration test pulse signal to the reference driver channel 8c, and in the test apparatus 4 the test signal input point of time of the calibration test signal, sent back by the comparator channel 9a and correspondingly retarded by the corresponding delay mechanism, is measured, and compared with the—predetermined—reference point of time $t_x$, etc., etc., until it is—again—determined that the test signal input point of time and the reference point of time $t_x$ are identical and/or essentially identical.

The delay period $t_{delay,5,2}$ (and/or data characterizing the applicable setting of the delay mechanism) generated by the delay mechanism allocated to the driver channel 8c is—again—stored in the above storage facility of the test apparatus 4.

Next the setting of the delay mechanism allocated to the driver channel 8c can—again—be deliberately correspondingly changed, e.g. the delay period generated by the delay mechanism can be correspondingly increased or reduced and the steps corresponding with the above calibration process sub-steps IIb,1-IIb,4—can again be executed.

The delay period $t_{delay,5,3}$ (and/or data characterizing the applicable setting of the delay mechanism) determined for the delay mechanism allocated to the driver channel 8c—when the test signal input points of time and reference point of time $t_x$ are identical—is then—again—stored in the storage facility of the test apparatus 4, etc.

As a last step, a median value for the delay periods $t_{delay,5.1}$, $t_{delay,5.2}$, $t_{delay,5.3}$, etc. determined for the delay mechanism allocated to the driver channel 8c is determined and stored in the storage facility, and the (median) delay period (and/or the setting of the delay mechanism allocated to this setting) determined in this way is fixed as the standard delay period and/or standard setting for the corresponding delay mechanism.

Next, several corresponding calibration process sub-steps can be correspondingly executed in succession—for a further ((third) non-reference) driver channel (and with the use of the sixth wafer structure field IIc—shown in FIG. 3—and—furthermore—of the reference comparator channel 9a)—as illustrated above for the first and second non-reference driver channel 8b, 8c in relation to the calibration process sub-steps IIa,1-IIa,4 and/or IIb,1-IIb,4 (i.e.—several successive—calibration process sub-steps corresponding with the above calibration process sub-steps IIa,1-IIa,4 and/or IIb,1-IIb,4).

Thereby—as correspondingly illustrated above—delay periods may be determined for the ((third) non-reference) driver channel, and/or the delay mechanism allocated to it, for which the test signal input point of time and the reference point of time $t_x$ are identical and/or essentially identical.

Then a median value of the correspondingly determined delay periods may—again—be generated and the (median) delay period (and/or the setting of the delay mechanism allocated to it) determined in this way fixed as the standard delay period and/or standard setting for the corresponding delay mechanism for the normal operation of the test apparatus 4 (during the testing of components).

The above steps, corresponding with the process steps IIa, IIb, IIc (with the calibration process sub-steps corresponding with the above calibration process sub-steps IIa,1-IIa,4 and/or IIb,1-IIb,4 performed repeatedly in succession in each case) are executed—with the use of the above reference comparator channel 9a—for all non-reference driver channels.

Advantageously, the driver channels 8a, 8b, 8c, and/or the comparator channels 9a, 9b, 9c shown in FIG. 2, may all be of the same length, and/or the lengths of the wafer lines 10a, 10b, 10c connecting the reference driver channel 8a with the relevant (non-reference) comparator channels 9b, 9c may in each case be essentially the same, and/or the lengths of the relevant wafer lines 10d, 10e, 10f connecting the (non-reference) driver channels 8b, 8c with the reference comparator channel 9a may in each case be essentially the same (and may e.g. be essentially the same as those of the wafer lines 10a, 10b, 10c connecting the reference driver channel 8a with each of the (non-reference) comparator channels 9b, 9c).

Even before (or alternatively after) the above process steps Ia, Ib, Ic, IIa, IIb, IIc have been performed etc. the reference driver channel 8a and the reference comparator channel 9a may be matched in such a way (e.g. in relation to a positive flank of the reference pulse) that the value for the above reference point of time $t_x$ is identical for both reference channels 8a, 9a and/or that an identical value for both reference channels 8a, 9a may be used for the above reference point of time $t_x$.

In order to achieve this for instance, reference channel 8a and reference channel 9a may be matched—with the use of conventional measuring processes—in such a way (e.g. by means of an appropriate setting of the delay mechanism allocated to the applicable reference channel 8a, 9a, and/or by adjusting the delay period generated by the delay mechanism allocated to the applicable reference channel 8a, 9a), that identical signal propagation delay times and/or signal delay periods are created—in total—for the reference driver channel 8a and the reference comparator channel 9a.

By means of the above process and system, a probe card and/or test apparatus calibration delivering relatively high accuracy is achieved, which calibration is independent of the probe card 2 applied in each case, and by means of which the time required for the calibration may be kept relatively brief in total.

What is claimed is:

1. A device for calibration of a probe card and/or of a semi-conductor component test apparatus, comprising:
   a first connection, at which a calibration signal is applied;
   a second connection, configured for connection with the first connection at which the calibration signal, is emitted;
   a third connection, at which a further calibration signal, is applied; and
   a fourth connection, configured for connection with the third connection, at which the further calibration signal is emitted;
   wherein the device is configured such that, in a first setting of a probe card, a first contact of the probe card configured for connection with a reference driver channel contacts the first connection, and a second contact of the probe card configured for connection with a first comparator channel, contacts the second connection, and wherein the device is further configured such that, in a second setting of the probe card, the first contact of the probe card configured for connection with the reference driver channel, contacts the third connection, and a third contact of the probe card, configured for connection with a second comparator channel contacts the fourth connection.

2. The device according to claim 1, wherein the device is a wafer.

3. The device according to claim 2, in which the first connection and the second connection, and/or the third connection and the fourth connection are connected via one or several structures created on or in the wafer.

4. A system, comprising:
   a device for calibration of a probe card and/or of a semi-conductor component test apparatus, comprising:
     a first connection, at which a calibration signal is applied,
     a second connection, configured for connection with the first connection at which the calibration signal, is emitted,
     a third connection, at which a further calibration signal, is applied, and
     a fourth connection, configured for connection with the third connection, at which the further calibration signal is emitted, wherein the device is a wafer and in which the first connection and the second connection, and/or the third connection and the fourth connection are connected via one or several structures created on or in the wafer; and
   a probe card, wherein the device is configured such that, in a first setting of the probe card, a first contact of the probe card configured for connection with a reference driver channel contacts the first connection, and a second contact of the probe card configured for connection with a first comparator channel, contacts the second connection, and wherein the device is further configured such that, in a second setting of the probe card, the first contact of the probe card configured in connection with the reference driver channel, contacts the third connection, and the third contact of the probe card, configured for connection with a second comparator channel contacts the fourth connection.

5. The system according to claim 4, further comprising a semi-conductor component test apparatus connectable to the probe card.

6. A calibration system comprising:
a semi-conductor component test apparatus comprising:
one or more driver channels for emitting a calibration signal; and
one or more comparator channels for receiving the calibration signal;
a probe card connected with the driver channel, wherein the probe card includes:
a first contact configured for connection to the one or more drive channels; and
second and third contacts configured for connection to the one or more comparator channels;
a feedback device for feeding back the calibration signal via the probe card and the one or more comparator channels to the test apparatus, wherein the feedback device includes:
a first connection configured to receive the calibration signal;
a second connection configured to connect with the first connection and to emit the received calibration signal;
a third connection configured to receive a further calibration signal; and
a fourth connection configured to connect with the third connection and to emit the received further calibration signal, wherein the feedback device is configured such that, in a first setting of the probe card, the first contact of the probe card configured for connection with the one or more driver channels contacts the first connection, and the second contact of the probe card configured for connection with one of the one or more comparator channels, contacts the second connection, and wherein the feedback device is further configured such that, in a second setting of the probe card, the first contact of the probe card configured for connection with the one or more driver channels, contacts the third connection, and the third contact of the probe card, configured for connection with another one of the one or more second comparator channels contacts the fourth connection;
a signal delay device adapted to change a signal propagation time of the calibration signal through the one or more driver channels and the one or more comparator channels such that a point of time when the changed calibration signal is received at the first connection or the further calibration signal is received at the third connection corresponds to a predetermined time value.

7. The calibration system of claim 6 wherein the feedback device comprises a wafer.

8. The calibration system of claim 7 in which the first connection and the second connection, and/or the third connection and the fourth connection are connected via one or several structures created on or in the wafer.

9. The calibration system of claim 6 wherein the signal delay device is contained within the semi-conductor component test apparatus.

* * * * *